(12) United States Patent
Jeanrot et al.

(10) Patent No.: US 12,352,791 B2
(45) Date of Patent: Jul. 8, 2025

(54) SERIAL LINK CLOCK SYNCHRONISATION

(71) Applicant: SAGEMCOM ENERGY & TELECOM SAS, Bois-Colombes (FR)

(72) Inventors: Marc Jeanrot, Bois-Colombes (FR); Christophe Grincourt, Bois-Colombes (FR)

(73) Assignee: SAGEMCOM ENERGY & TELECOM SAS, Bois-Colombes (FR)

( * ) Notice: Subject to any disclaimer, the term of this patent is extended or adjusted under 35 U.S.C. 154(b) by 0 days.

(21) Appl. No.: 18/930,345

(22) Filed: Oct. 29, 2024

(65) Prior Publication Data
US 2025/0138067 A1    May 1, 2025

(30) Foreign Application Priority Data

Oct. 30, 2023   (FR) ...................................... 2311788

(51) Int. Cl.
| | | |
|---|---|---|
| *G01R 22/10* | (2006.01) | |
| *G06F 1/12* | (2006.01) | |
| *G06F 1/14* | (2006.01) | |
| *G06F 13/24* | (2006.01) | |
| *G06F 13/42* | (2006.01) | |

(52) U.S. Cl.
CPC ............... *G01R 22/10* (2013.01); *G06F 1/12* (2013.01); *G06F 1/14* (2013.01); *G06F 13/24* (2013.01); *G06F 13/4282* (2013.01); *G06F 2213/0002* (2013.01)

(58) Field of Classification Search
CPC ..... G01R 22/10; G06F 13/24; G06F 13/4282; G06F 1/12; G06F 1/14; G06F 2213/0002
See application file for complete search history.

(56) References Cited

U.S. PATENT DOCUMENTS

| | | | |
|---|---|---|---|
| 6,611,922 B2 * | 8/2003 | Ozcetin ..................... G06F 1/14 |
| | | | 713/400 |
| 11,662,475 B2 | 5/2023 | Somieski et al. | |
| 2010/0283452 A1 * | 11/2010 | Voisine .................. G01R 11/02 |
| | | | 324/96 |
| 2016/0363956 A1 * | 12/2016 | Moore ....................... G06F 1/30 |
| 2019/0383866 A1 * | 12/2019 | Stenberg .............. G01R 22/068 |
| 2021/0305829 A1 * | 9/2021 | Ramirez ................... H02J 7/35 |

FOREIGN PATENT DOCUMENTS

FR    3119039 A1    7/2022

* cited by examiner

*Primary Examiner* — Glenn A. Auve
(74) *Attorney, Agent, or Firm* — MUNCY, GEISSLER, OLDS & LOWE, P.C.

(57) ABSTRACT

A method for synchronising a clock of an electricity meter which includes a first processing unit including a first port arranged to be connected to an external apparatus, having the following steps: receiving, via the first port, a first frame containing a reference time; configuring the first port to operate in an interrupt-triggering mode; receiving, via the first port, a pulse that specifies a synchronisation time, and triggering an interrupt that leads to the reference time being recorded as a current time at the synchronisation time; reconfiguring the first port so as to communicate via the first port using the serial link.

15 Claims, 2 Drawing Sheets

SERIAL LINK CLOCK SYNCHRONISATION

The invention relates to the field of electricity meters, and in particular industrial meters.

BACKGROUND OF THE INVENTION

Some modern industrial electricity meters are configured to measure, in addition to the electric power consumption of the installation to which they are connected, quality parameters of the power supplied by the electric power distribution network.

Power supply quality parameters include, in particular, the supply voltage frequency and amplitude, dips, overvoltages, power outages, voltage unbalance, etc.

The International Electrotechnical Commission (IEC) has drawn up the quality measurement standard IEC 61000-4-30, which specifies how to measure those parameters.

To comply with IEC 61000-4-30 Class A, electricity meters must have a very precise clock that allows them to timestamp the occurrence of different events on the network very precisely.

The very precise timestamping of the events makes it possible, in particular, to know where in the network the event occurred, through the analysis of the data from a plurality of meters.

Said clock must not drift by more than one network period with respect to UTC (Coordinated Universal Time), which, for a supply voltage frequency of 60 Hz, corresponds to +/−16.67 ms.

However, the internal clocks of the meters have a natural drift associated mainly with the oscillators. It is therefore appropriate to regularly resynchronise the meters with UTC.

To achieve time synchronisation, some current meters are equipped with a hardware signal (All or Nothing input), often called a "TOP SYNCHRO signal", which allows a reference clock (having access to UTC) to synchronise the internal clock of the meter. This solution therefore requires a dedicated port, which increases the cost of the meter.

Other meters contain an NTP (Network Time Protocol) server enabling this synchronisation, either via a radio link (GPS) or via a wired link with the IEEE 1588 protocol (Ethernet link).

These solutions are often no longer accepted by energy suppliers or even customers because they are easily "hackable". They are also relatively expensive.

OBJECT OF THE INVENTION

The object of the invention is to resynchronise the internal clock of an electricity meter in a simple, inexpensive and secure manner.

SUMMARY OF THE INVENTION

With the aim of achieving this object, a method is proposed for synchronising an internal clock of an electricity meter which comprises a first processing unit comprising a first port arranged to be connected to an external apparatus, the synchronisation method comprising the following first steps, carried out successively by the first processing unit and repeated at predefined intervals:
- receiving, via the first port, a first frame that is transmitted by the external apparatus using a serial link and contains a reference time;
- configuring the first port to operate in an interrupt-triggering mode;
- receiving, via the first port, a pulse that is transmitted by the external apparatus and specifies a synchronisation time, and triggering an interrupt that leads to the reference time being recorded as a current time at the synchronisation time;
- reconfiguring the first port so as to communicate via the first port using the serial link.

The internal clock of the electricity meter is therefore synchronised by an apparatus external to the meter, such as a modem, via the serial link. It is therefore possible to use a pre-existing serial link, meaning that carrying the synchronisation method does not require any additional connection and is simple and inexpensive. This serial link is difficult to hack.

In addition, a synchronisation method as described above is proposed in which the first steps further comprise the step, following the receipt of the first frame, of transmitting a second frame, which contains an acknowledgement message, to the external apparatus via the first port using the serial link.

In addition, a synchronisation method as described above is proposed in which a length of time between the transmission of the first frame and the transmission of the second frame is a predefined length of time between 1 s and 3 s.

In addition, a synchronisation method as described above is proposed in which the first steps further comprise the step, following the reconfiguration of the first port, of transmitting a third frame, which contains end of time-setting information, to the external apparatus via the first port using the serial link.

In addition, a synchronisation method as described above is proposed in which the interrupt is a rising-edge interrupt.

In addition, a synchronisation method as described above is proposed in which the serial link is an RS-232 link.

In addition, an electricity meter is proposed, comprising a first processing unit which comprises a first port and in which the first steps of the synchronisation method as described above are carried out.

In addition, an electricity meter as described above is proposed, the electricity meter furthermore being arranged to monitor an electric power distribution network to which it is connected, to timestamp events occurring on the electric power distribution network using the current time, and to send network monitoring information to the external apparatus using the serial link.

In addition, a computer program is proposed, comprising instructions that cause the first processing unit of the electricity meter as described above to execute the first steps of the synchronisation method as described above.

In addition, a computer-readable storage medium is proposed, on which the computer program as described above is stored.

In addition, a method is proposed for synchronising an internal clock of an electricity meter arranged to be connected to an external apparatus which comprises a second processing unit comprising a second port arranged to be connected to the electricity meter, the synchronisation method comprising the following second steps, carried out successively by the second processing unit and repeated at predefined intervals:
- transmitting a first frame, which contains a reference time, to the electricity meter via the second port using a serial link;
- configuring the second port to operate in a pulse-generation mode;
- transmitting a pulse, which specifies a synchronisation time, to the electricity meter via the second port;

reconfiguring the second port so as to communicate via the second port using the serial link.

In addition, a synchronisation method as described above is proposed in which the pulse has a defined duration with an accuracy of +/−1 ms.

In addition, a synchronisation method as described above is proposed in which the second steps further comprise the step, following the transmission of the first frame, of waiting to receive a second frame, which contains an acknowledgement message, via the second port before configuring the second port to operate in the pulse-generation mode.

In addition, a modem is proposed, comprising a second processing unit which comprises a second port and in which the second steps of the synchronisation method as described above are carried out.

In addition, a computer program is proposed, comprising instructions that cause the second processing unit of the modem as described above to execute the second steps of the synchronisation method as described above.

In addition, a computer-readable storage medium is proposed, on which the computer program as described above is stored.

In addition, a system is proposed, comprising an electricity meter as described above and a modem as described above.

The invention can be better understood in the light of the following description of a particular, non-limiting embodiment of the invention.

BRIEF DESCRIPTION OF THE DRAWINGS

Reference will be made to the accompanying drawings, among which.

DETAILED DESCRIPTION OF THE INVENTION

Figure 1:
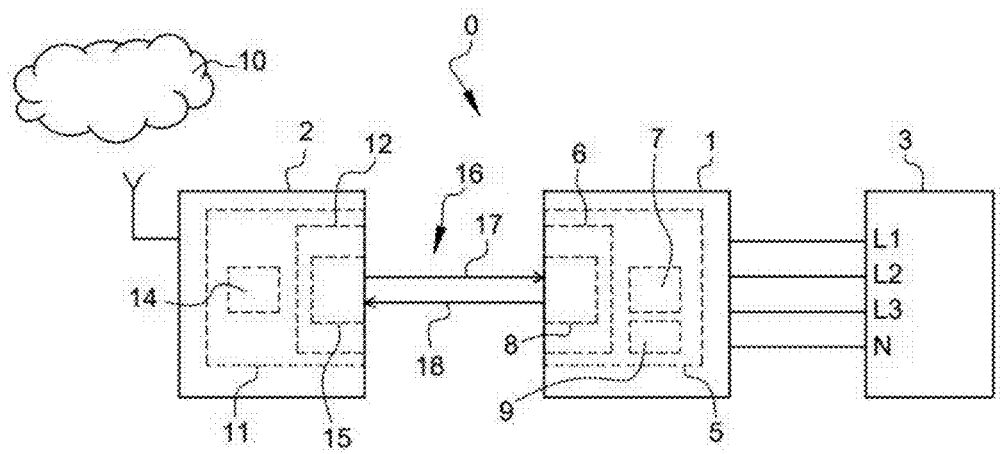
FIG. 1 shows a system comprising an electricity meter and a modem.

With reference to FIG. 1, the system 0 comprises a meter 1 and an apparatus external to the meter 1, in this case a modem 2.

The meter 1 is an industrial electricity meter which, in this case, is connected to an electric power distribution network 3, which is a three-phase network and comprises a first phase L1, a second phase L2, a third phase L3 and a neutral N.

The electricity meter 1 is connected to an industrial electrical installation to which the network 3 supplies electric power.

The meter 1 is also connected to the modem 2.

The meter 1 comprises a first processing unit 5.

In this case, the first processing unit 5 is configured, in a conventional manner, to acquire and process current and voltage measurements taken by the sensors of the meter 1, so as to measure the electric power consumed by the installation.

The first processing unit 5 is also configured to measure quality parameters of the power supplied by the network 3 and to timestamp events occurring on the network 3.

The first processing unit 5 comprises at least one first processing component 6.

By way of example, the first processing component 6 is a general-purpose processor, a microcontroller, a processor specialised in signal processing (known as a digital signal processor (DSP)), or a programmable logic circuit such as a field programmable gate array (FPGA) or an application-specific integrated circuit (ASIC).

In this case, the first processing component 6 is a microcontroller.

The first processing unit 5 also comprises one or more memories 7, which are connected to or integrated in the first processing component 6. At least one of these memories 7 forms a computer-readable storage medium on which there is stored at least one computer program comprising instructions that cause the first processing component 6 to execute the first steps of the synchronisation phases described below.

The first processing unit 5 comprises at least one first port 8, which can be configured in a serial communication mode, in which the first port 8 can be used to implement a serial link (here RS-232), and in an interrupt-triggering mode.

The first port 8 is a port of the first processing component 6 and comprises two pins of the first processing component 6.

In this case, the first port 8 is a port that can be configured in UART mode (Universal Asynchronous Receiver Transmitter) or in GPIO mode (General Purpose Input/Output).

In this case, therefore, the serial communication mode corresponds to the UART mode and the interrupt-triggering mode corresponds to the GPIO mode.

The first processing unit 5 also comprises an internal clock 9, which is used in particular to timestamp the above-mentioned events occurring on the distribution network 3.

The modem 2 is in turn configured to form a communication interface between the meter 1 (and possibly other meters) and a communication network 10 (the internet, for example). The meter 1 therefore communicates with the network 10 via the modem 2.

The modem 2 has access to UTC owing to its connection to the network 10.

The modem 2 comprises a second processing unit comprising at least one second processing component 12.

By way of example, the second processing component 12 is a general-purpose processor, a microcontroller, a processor specialised in signal processing (known as a digital signal processor (DSP)), or a programmable logic circuit such as a field programmable gate array (FPGA) or an application-specific integrated circuit (ASIC).

In this case, the second processing component 12 is a microcontroller.

The second processing unit 11 also comprises one or more memories 14, which are connected to or integrated in the second processing component 12. At least one of these memories 14 forms a computer-readable storage medium on which there is stored at least one computer program comprising instructions which cause the second processing component 12 to execute the second steps of the synchronisation phases described below.

The second processing unit 11 comprises at least one second port 15, which can be configured in a serial communication mode, in which the second port 15 can be used to implement the serial link (here RS-232), and in a pulse-generation mode, which allows interrupts to be generated in the first processing unit 5 from outside the meter 1.

The second port 15 is a port of the second processing component 12 and comprises two pins of the second processing component 12.

The second port 15 is a port that can be configured in UART mode or GPIO mode.

In this case, therefore, the serial communication mode corresponds to the UART mode and the pulse-generation mode corresponds to the GPIO mode.

The first port 8 of the meter 1 and the second port 15 of the modem 2 are connected by a cable 16 comprising two wires 17, 18, each connecting one pin of the first port 8 to one pin of the second port 15.

When the first port 8 and the second port 15 are configured in the serial communication mode, the meter 1 and the modem 2 exchange data using the RS-232 serial link, via the first port 8, the second port 15 and the wires 17, 18. The modem 2 sends data to the meter 1 via the wire 17, and the meter 1 transmits data to the modem 2 via the wire 18.

Figure 2:
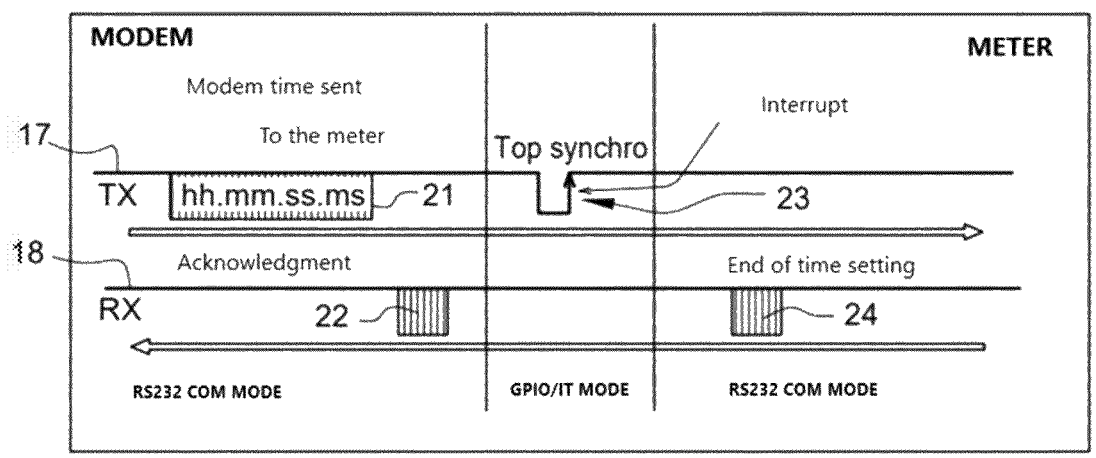
FIG. 2 shows a synchronisation phase of the clock of the meter.
Figure 3:
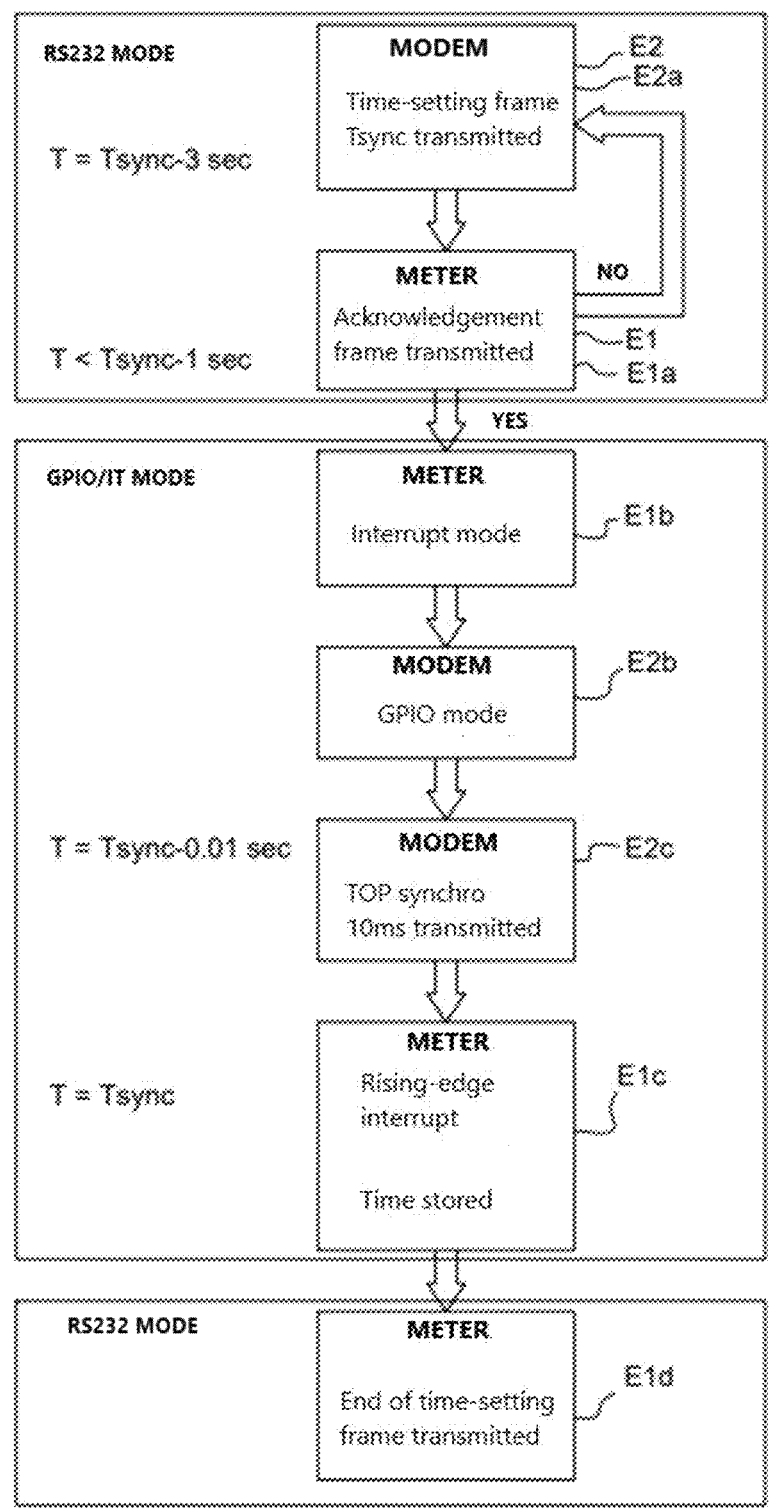
FIG. 3 shows the steps of a synchronisation phase.

With reference to FIGS. 2 and 3, the modem 2 regularly triggers the synchronisation of the internal clock 9 of the meter 1 to UTC.

The synchronisation phase is repeated at predefined (fixed or variable) intervals, e.g. daily or weekly.

Each synchronisation phase comprises first steps E1, carried out successively by the first processing unit 5 of the electricity meter 1, second steps E2, carried out successively by the second processing unit 11 of the modem 2.

The first steps E1 and the second steps E2 are therefore repeated at predefined intervals.

Each synchronisation phase begins while the first port 8 and the second port 15 are in serial communication mode.

The modem 2 acquires the UTC on the network 10 and produces from UTC a reference time corresponding to the current time at a synchronisation time Tsync.

Then, at a predefined time preceding the time Tsync, for example at Tsync−3 s, the second processing unit 11 of the modem 2 transmits a first frame 21, which contains the reference time, to the meter 1 via the second port 15 using the serial link (step E2a).

By way of example, the reference time is expressed in hours, minutes, seconds and milliseconds, for example in the following format:

hh.mm.ss.ms where h denotes hour, m minute, s second and ms millisecond.

The first processing unit 5 of the meter 1 then receives the first frame 21 via the first port 8.

Following the receipt of the first frame 21, the meter 1 transmits a second frame 22, which contains an acknowledgement message, to the modem 2 via the first port 8 using the serial link (step E1a).

The length of time between the transmission of the first frame 21 and the transmission of the second frame 22 is equal to a predefined length of time, which is between 1 s and 3 s, for example.

In this case, this predefined length of time is less than a maximum length of time of, for example, 2 s.

The second frame 22 is transmitted at a time preceding Tsync by a length of time of 1 s, for example.

This "timeout" of (for example) 2 s is added so as not to block the RS-232 communication.

Unless this acknowledgement frame 22 is transmitted, the modem 2 retransmits the first frame 21 containing the reference time.

After having transmitted the second frame 22, the first processing unit 5 of the meter 1 configures the first port 8 to operate in interrupt mode (step E1b).

The second processing unit 11 of the modem 2 configures the second port 15 to operate in the pulse-generation mode (step E2b).

The second processing unit 11 then transmits a pulse 23 to the meter 1 via the second port 15 (step E2c).

This pulse 23 begins with a falling edge and ends with a rising edge. The pulse is calibrated very accurately. It has a defined duration with an accuracy of +/−1 ms. In this example, the duration is 10 ms.

The pulse 23 defines the synchronisation time, which corresponds to the rising edge in this case. The pulse 23 is thus transmitted at the time:

Tsync−10 ms.

The first processing unit 5 then receives this pulse 23 via the first port 8 and triggers an interrupt which leads to the reference time being recorded as the current time at the synchronisation time (step E1c).

In this example, the interrupt is a rising-edge interrupt.

The first processing unit 5 reconfigures the first port 8 so as to communicate via the first port 8 using the serial link (serial communication mode). The modem 2 reconfigures the second port 15 so as to communicate via the second port 15 using the serial link (serial communication mode).

The first processing unit 5 then transmits a third frame 24, which contains end of time-setting information, to the modem 2 via the first port 8 using the serial link (step E1d).

Synchronisation comes to an end.

The clock 9 of the meter 1 is resynchronised. The current time is extremely accurate. Its accuracy depends mainly on the accuracy of the definition of the time Tsync and therefore on the accuracy of the duration of the pulse 23 which, as shown, has been calibrated very precisely.

The meter 1 thus monitors the electric power distribution network 3 to which it is connected and, in particular, very accurately timestamps events occurring on the distribution network 3 using the current time. From this monitoring, the meter 1 produces monitoring information of the network 3 (including the timestamped events) and sends the monitoring information of the network 3 to the modem 2 via the cable 16 using the serial link.

It goes without saying that the invention is not limited to the embodiment described but comprises any variant falling under the scope of the invention as defined by the claims.

The serial link is not necessarily an RS-232 link; it could be another type of serial link, for example RS-485.

The synchronisation time is defined by the interrupt (and therefore the pulse) but it could be a time other than that of a rising edge (for example that of a falling edge, or a time defined by a predetermined length of time following the interrupt).

The lengths of time mentioned here (2 s, 10 ms, etc.) could be different.

The apparatus connected to the meter is not necessarily a modem; it can be any apparatus that can be connected to a meter by a serial link and has access to UTC (e.g. a data concentrator).

The step of transmitting the second frame is not mandatory; the modem could transmit the pulse generating the interrupt without waiting for acknowledgement. The step of transmitting the third frame is not mandatory either.

The invention can be implemented using an electricity meter that is single-phase or multi-phase (however many phases there are).

The invention claimed is:

1. A method for synchronising an internal clock of an electricity meter which comprises a first processing unit comprising a first port arranged to be connected to an external apparatus, the method comprising first steps, carried out successively by the first processing unit and repeated at predefined intervals:

receiving, via the first port, a first frame that is transmitted by the external apparatus using a serial link and contains a reference time;

configuring the first port to operate in an interrupt-triggering mode;

receiving, via the first port, a pulse that is transmitted by the external apparatus and specifies a synchronisation time, and triggering an interrupt that leads to the reference time being recorded as a current time at the synchronisation time; and reconfiguring the first port so as to communicate via the first port using the serial link.

2. The method according to claim 1, wherein the first steps further comprise the step, following the receipt of the first frame, of transmitting a second frame, which contains an acknowledgement message, to the external apparatus via the first port using the serial link.

3. The method according to claim 2, wherein a length of time between the transmission of the first frame and the transmission of the second frame is a predefined length of time between 1 s and 3 s.

4. The method according to claim 1, wherein the first steps further comprise the step, following the reconfiguration of the first port, of transmitting a third frame, which contains end of time-setting information, to the external apparatus via the first port using the serial link.

5. The method according to claim 1, wherein the interrupt is a rising-edge interrupt.

6. The method according to claim 1, wherein the serial link is an RS-232 link.

7. An electricity meter comprising a first processing unit which comprises a first port and in which the first steps of the method according to claim 1 are carried out.

8. The electricity meter according to claim 7, the electricity meter furthermore being arranged to monitor an electric power distribution network to which it is connected, to timestamp events occurring on the electric power distribution network using the current time, and to send network monitoring information to the external apparatus using the serial link.

9. A system comprising:

an electricity meter according to claim 7; and a modem comprising a second processing unit comprising a second port arranged to be connected to the electricity meter, wherein the external apparatus is the modem, wherein the second processing unit successively carries out and repeats at predefined intervals:

transmitting the first frame to the electricity meter via the second port using the serial link;

configuring the second port to operate in a pulse-generation mode;

transmitting the pulse to the electricity meter via the second port; and reconfiguring the second port so as to communicate via the second port using the serial link.

10. A non-transitory computer-readable storage medium on which a computer program is stored, wherein the computer program comprises instructions that cause a processing unit of an electricity meter to execute the first steps of the method according to claim 1.

11. A method for synchronising an internal clock of an electricity meter arranged to be connected to an external apparatus which comprises a processing unit comprising a port arranged to be connected to the electricity meter, the method comprising the following second steps, carried out successively by the processing unit and repeated at predefined intervals:

transmitting a first frame, which contains a reference time, to the electricity meter via the port using a serial link;

configuring the port to operate in a pulse-generation mode;

transmitting a pulse, which specifies a synchronisation time, to the electricity meter via the port; and reconfiguring the port so as to communicate via the second using the serial link.

12. The method according to claim 11, wherein the pulse has a defined duration with an accuracy of +/−1 ms.

13. The method according to claim 11, wherein the steps further comprise the step, following the transmission of the first frame, of waiting to receive a second frame, which contains an acknowledgement message, via the port before configuring the port to operate in the pulse-generation mode.

14. A modem comprising a processing unit which comprises a port and in which the steps of the method according to claim 11 are carried out.

15. A non-transitory computer-readable storage medium on which a computer program is stored wherein the computer program comprises instructions that cause a processing unit of a modem to execute the steps of the method according to claim 11.

* * * * *